(12) United States Patent
Todorov et al.

(10) Patent No.: US 7,777,152 B2
(45) Date of Patent: Aug. 17, 2010

(54) HIGH AC CURRENT HIGH RF POWER AC-RF DECOUPLING FILTER FOR PLASMA REACTOR HEATED ELECTROSTATIC CHUCK

(75) Inventors: Valentin N. Todorov, Palo Alto, CA (US); Michael D. Willwerth, San Ramon, CA (US); Alexander Paterson, San Jose, CA (US); Brian K. Hatcher, San Jose, CA (US); James E. Sammons, III, San Jose, CA (US); John P. Holland, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 819 days.

(21) Appl. No.: 11/671,927

(22) Filed: Feb. 6, 2007

(65) Prior Publication Data

US 2007/0284344 A1 Dec. 13, 2007

Related U.S. Application Data

(60) Provisional application No. 60/813,572, filed on Jun. 13, 2006.

(51) Int. Cl.
*B23K 9/02* (2006.01)
*H01P 5/08* (2006.01)
*C23C 16/00* (2006.01)
(52) U.S. Cl. .............. 219/121.54; 333/17.3; 118/723 E
(58) Field of Classification Search .................
219/121.36–121.59, 390.391, 444.1; 118/723 R, 118/723 E, 723 ER, 723 I, 723 IR; 279/128; 361/230–235; 156/345.4–345.55; 336/155, 336/160, 171, 174; 333/202–212, 219, 219.1, 333/219.2, 17.3, 24 C
See application file for complete search history.

(56) References Cited

U.S. PATENT DOCUMENTS 5,103,367 A * 4/1992 Horwitz et al. ............. 361/234

(Continued)

*Primary Examiner*—Sang Y Paik
(74) *Attorney, Agent, or Firm*—Law Office of Robert M. Wallace

(57) ABSTRACT

An RF blocking filter isolates a two-phase AC power supply from at least 2 kV p-p of power of an HF frequency that is reactively coupled to a resistive heating element, while conducting several kW of 60 Hz AC power from the two-phase AC power supply to the resistive heating element without overheating, the two-phase AC power supply having a pair of terminals and the resistive heating element having a pair of terminals. The filter includes a pair of cylindrical non-conductive envelopes each having an interior diameter between about one and two inches and respective pluralities of fused iron powder toroids of magnetic permeability on the order of about 10 stacked coaxially within respective ones of the pair of cylindrical envelopes, the exterior diameter of the toroids being about the same as the interior diameter of each of the envelopes. A pair of wire conductors of diameter between 3 mm and 3.5 mm are helically wound around corresponding ones of the pair of envelopes to form respective inductor windings in the range of about 16 to 24 turns for each the envelope, each of the conductors having an input end and an output end. The input end of each one of the conductors is coupled to a corresponding one of the pair of terminals of the two-phase AC power supply, and the output end of each one of the conductors is coupled to a corresponding one of the pair of terminals of the resistive heating element.

15 Claims, 2 Drawing Sheets

U.S. PATENT DOCUMENTS

| | | | | |
|---|---|---|---|---|
| 5,571,366 A | * | 11/1996 | Ishii et al. | 156/345.26 |
| 5,585,766 A | * | 12/1996 | Shel | 333/17.3 |
| 5,737,177 A | * | 4/1998 | Mett et al. | 361/234 |
| 5,770,982 A | * | 6/1998 | Moore | 333/32 |
| 5,812,361 A | * | 9/1998 | Jones et al. | 361/234 |
| 6,270,618 B1 | * | 8/2001 | Nakano et al. | 156/345.44 |
| 6,469,283 B1 | * | 10/2002 | Burkhart et al. | 219/486 |
| 2002/0100557 A1 | * | 8/2002 | Li et al. | 156/345.48 |

* cited by examiner

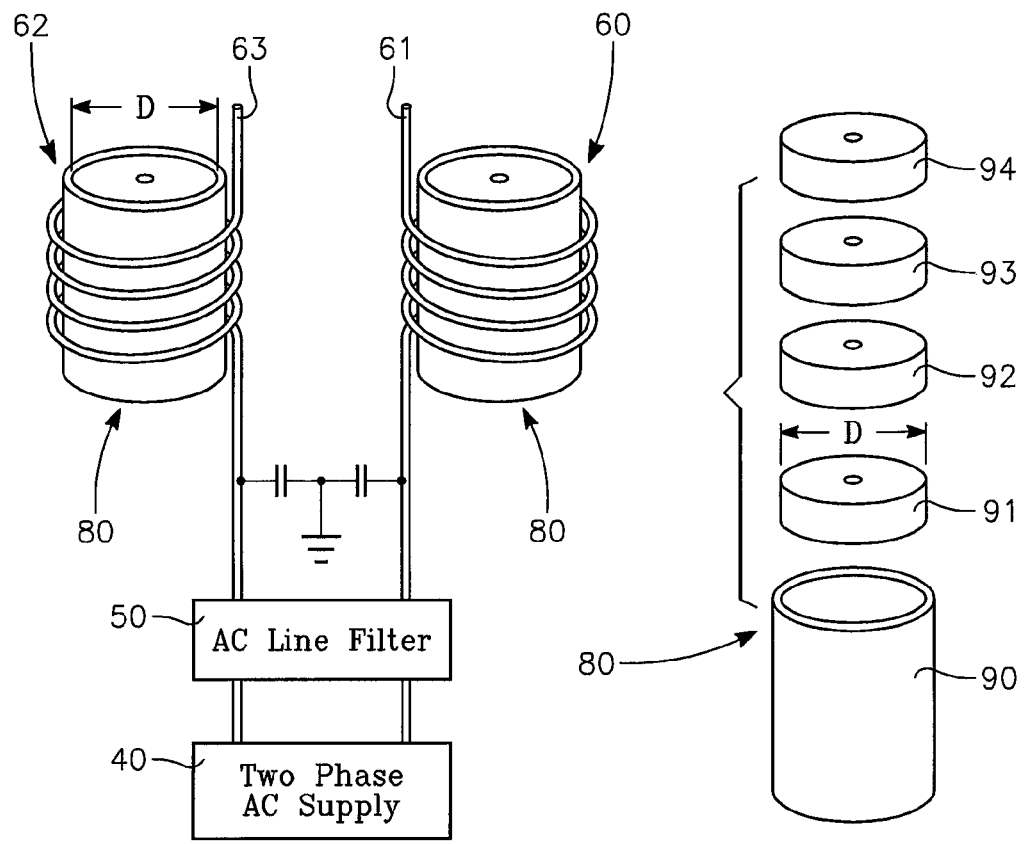
FIG. 1B
FIG. 1C
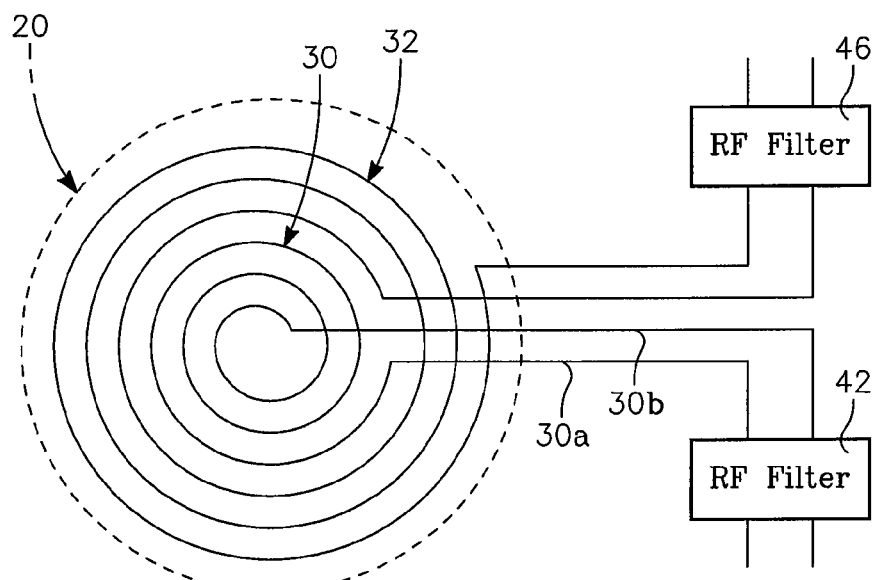
FIG. 2

HIGH AC CURRENT HIGH RF POWER AC-RF DECOUPLING FILTER FOR PLASMA REACTOR HEATED ELECTROSTATIC CHUCK

CROSS-REFERENCE TO RELATED APPLICATIONS

This application claims the benefit of U.S. Provisional Application Ser. No. 60/813,572, filed Jun. 13, 2006.

BACKGROUND OF THE INVENTION

Plasma reactors employed in semiconductor integrated circuit fabrication can use an electrostatic chuck (ESC) for holding the wafer inside the reactor chamber. Process control is enhanced by regulating the temperature of the semiconductor wafer held on the ESC. For example, a typical plasma etch process for forming high aspect ratio openings in the surface of a silicon wafer is carried out by introducing a process gas such as a fluorocarbon or fluorohydrocarbon gas into the chamber and coupling RF power into the chamber. Plasma RF source power for controlling plasma ion density may be applied by coupling VHF power to a ceiling electrode. Plasma RF bias power for controlling the plasma sheath voltage may be applied by coupling HF power to the ESC. In order to control the wafer temperature, an electrical heating element is provided within an insulating layer of the ESC as an electrically resistive element underlying the wafer support surface of the ESC. The RF bias power may be applied to a chucking electrode inside the insulating layer of the ESC. Alternatively, the RF bias power may be applied to a conductive base of the ESC that underlies the insulating layer of the ESC. In either case, some of the applied RF bias power capacitively couples to the electrical heating element, thereby diverting RF bias power away from the plasma. In fact, depending upon the design of the heating element, it is easier to couple RF bias power to the heating element than to the plasma. The electric heater circuit therefore is a significant RF load on the ESC or cathode. It changes the chamber impedance significantly. The RF current that is thus diverted flows through the heater current supply to RF ground. This diversion hampers control of the plasma because the plasma sheath voltage and ion energy (for example) are rendered uncertain and dependent upon the amount of capacitive coupling to the heater element, which may vary randomly.

In an effort to solve this problem, RF filters can be placed between the heating element and the heating current source. Such filters are designed to present a high impedance at the frequency of the RF bias power generator (typically but not necessarily at 13.56 MHz) to block RF current flow, while presenting little or no impedance to the 60 Hz heater supply current. In order to provide sufficient impedance at the RF bias frequency, commercially available RF filters typically include a choke or inductive winding around a magnetically permeable core about 0.65 mm in diameter having a very high permeability (e.g., a permeability within the range of 3000-7000, where permeability is the ratio between the permeability constant of the magnetic core and the permeability constant of air). Such a high permeability produces high magnetic flux in the core as a function of the RF voltage. We have found that at RF bias power levels required in typical plasma etch processes, e.g., 150 Watts at 13.56 MHz, the peak-to-peak RF voltage at the ESC can be as high as 2 kV. The magnetic flux in the core is a function of the RF voltage (2 kV) and the core permeability (4000), and is therefore very high. At such a high RF voltage, the high frequency (13.56 MHz) oscillation in magnetic field in the core causes extreme heating of the high permeability magnetic core and, ultimately, destruction and failure of the filter. We have found this problem in all of the commercially available RF filters we attempted to use with the ESC heater circuit. A solution to this problem did not seem possible because without a high permeability choke, the RF impedance at 13.56 MHz would be insufficient to prevent leakage of RF bias power through the heater circuit. For example, employing an air core choke (permeability of 1.0) would require over forty or more windings in the choke to provide sufficient inductive reactance. The problem with such an approach is that such a high number of turns in the choke winding would lead to a high capacitive reactance in the choke that would allow RF leakage.

Another problem is that the heater current, which can be as high as 40 amps, tends to heat the choke winding, which contributes to the problem of overheating in the RF filter.

SUMMARY OF THE INVENTION

An RF blocking filter isolates a two-phase AC power supply from at least 2 kV p-p of power of an HF frequency that is reactively coupled to a resistive heating element, while conducting several kW of 60 Hz AC power from the two-phase AC power supply to the resistive heating element without overheating, the two-phase AC power supply having a pair of terminals and the resistive heating element having a pair of terminals. The filter includes a pair of cylindrical non-conductive envelopes each having an interior diameter between about one and two inches and respective pluralities of fused iron powder toroids of magnetic permeability on the order of about 10 stacked coaxially within respective ones of the pair of cylindrical envelopes, the exterior diameter of the toroids being about the same as the interior diameter of each of the envelopes. A pair of wire conductors of diameter between 3 mm and 3.5 mm are helically wound around corresponding ones of the pair of envelopes to form respective inductor windings in the range of about 16 to 24 turns for each the envelope, each of the conductors having an input end and an output end. The input end of each one of the conductors is coupled to a corresponding one of the pair of terminals of the two-phase AC power supply, and the output end of each one of the conductors is coupled to a corresponding one of the pair of terminals of the resistive heating element. A pair of capacitors is connected between the input ends of respective ones of the pair of conductors and ground, each of the capacitors having a capacitance that forms a resonance with the inductance of the corresponding one of the inductors at a resonant frequency at least several MHz above the HF frequency, whereby the filter presents an inductive reactance at the HF frequency and has an RF attenuation of over 60 dB at the HF frequency.

BRIEF DESCRIPTION OF THE DRAWINGS

FIGS. 1A, 1B and 1C depict a plasma reactor that includes a pair of RF blocking filter embodying the invention, of which FIG. 1A is a simplified schematic diagram of the reactor, FIG. 1B is an enlarged perspective view of elements of the RF blocking filter and FIG. 1C is an exploded perspective view of a typical magnetic core of the blocking filter.

FIG. 2 is a top view of a portion of the reactor of FIG. 1A depicting the connection between respective RF blocking filters and inner and outer resistive heating elements in the ESC.

DETAILED DESCRIPTION OF THE INVENTION

Figure 1A:
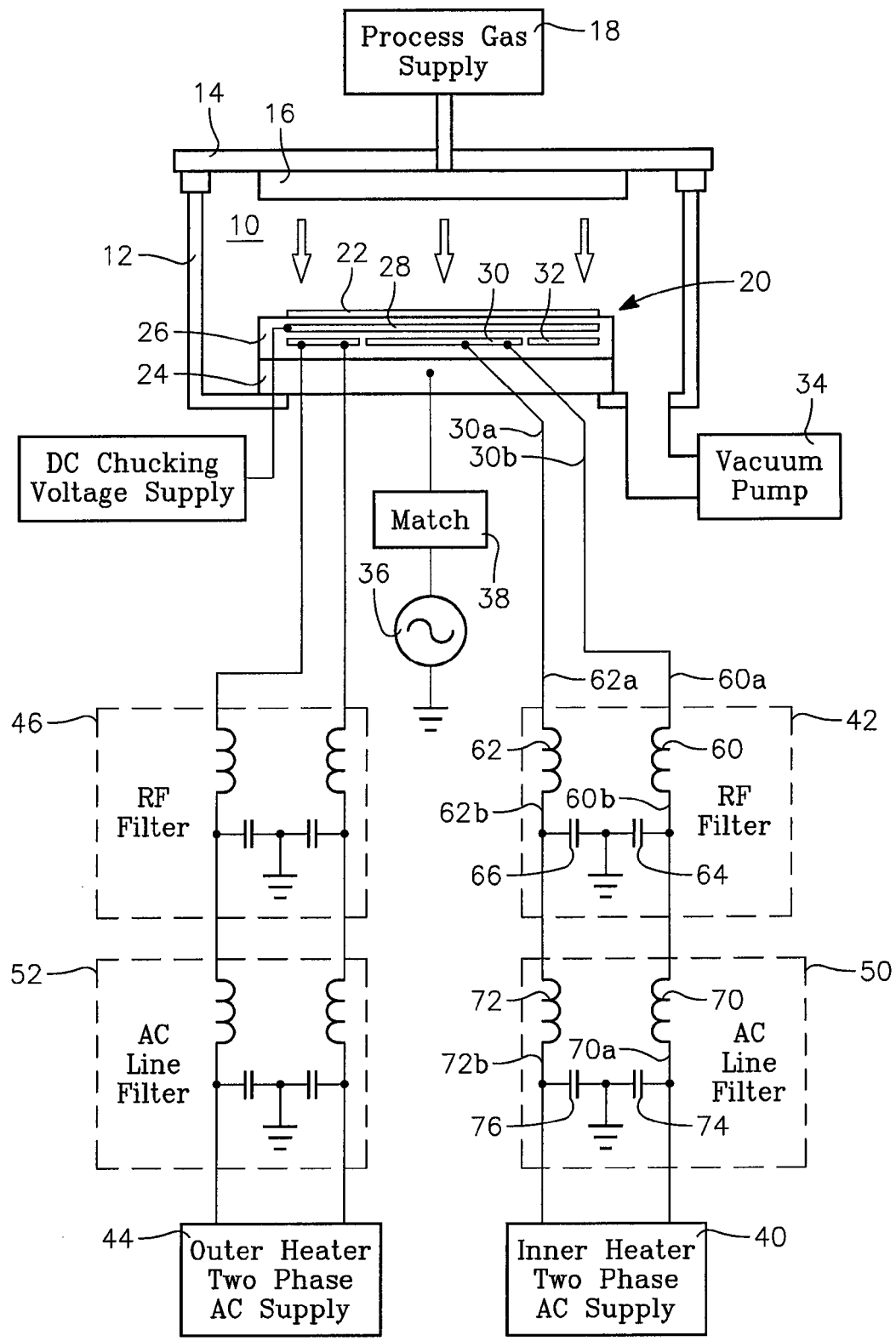

Referring to the apparatus of FIGS. 1A, 1B and 1C, a plasma reactor consists of a vacuum chamber 10 defined by a cylindrical side wall 12 supporting a ceiling 14 that includes a process gas distribution showerhead 16. A process gas supply 18 is coupled to the gas distribution showerhead. An electrostatic chuck (ESC) 20 holds a semiconductor wafer 22 in the chamber 10. The ESC 20 consists of a conductive base 24 and an insulating layer 26 that may be formed of a ceramic material. A chucking electrode 28 consisting of a conductive mesh is contained within the insulating layer 26. Inner and outer spiral heating elements 30, 32 (FIG. 2) are held within the insulating layer 26 beneath the chucking electrode 28. A vacuum pump 34 maintains a sub-atmospheric pressure within the chamber 10.

An RF bias power supply 36 is coupled through an impedance match circuit 38 to either the conductive base 24 or the chucking electrode 28. The RF bias supply preferably has an HF or LF frequency and its output level controls the plasma sheath voltage. In one embodiment, the RF bias frequency was 13.56 MHz. A two-phase AC inner heater supply 40 furnishes AC current to the inner heater element 30 through an RF filter 42. A two-phase AC outer heater supply 44 furnishes AC current to the outer heater element 32 through an RF filter 46. The RF filters 42, 46 prevent power of the RF bias generator 36 from leaking to the heater supplies 40, 44, which can otherwise occur by capacitive coupling through the insulating layer 26. At the same time, the RF filters 42, 46 permit as much as 8 kW of AC power to flow to the heater elements 30, 32. Each filter 42, 46 is capable of withstanding several kV p-p of 13.56 MHz RF voltage on the ESC while passing the 8 kW of 60 Hz heater supply current simultaneously without overheating. Optionally, AC line filters 50, 52 may be provided at the output of the current supplies 40, 44.

Each RF filter 42, 46 is identical in structure. The RF filter 42 is now described. A pair of choke inductors 60, 62 are connected at their output ends 60a, 62a to the ends 30a, 30b, respectively, of the inner heater conductor 30. The choke inductors 60, 62 are connected at their input ends 60b, 62b through the AC line filter 50 to the 2-phase outputs of the AC supply 40. The wafer temperature is regulated by controlling the AC supply current from the supply 40. A pair of shunt capacitors 64, 66 are connected between the inductor input ends 60b, 62b, respectively, to ground.

The AC line filters 50 and 52 may be of the same structure. The AC line filter 50 consists of a pair of inductors 70, 72 connected in series between the output ends 60b, 62b and the AC supply 40. A pair of shunt capacitors 74, 76 are connected between the input ends 70a, 72b of the inductors 70, 72 and ground, respectively.

Each of the RF-blocking choke inductors 60, 62 of the RF filter 42 has a low-permeability magnetic core 80 (permeability between 7 and 20 and preferably equal to about 10) formed of fused iron powder formed of a cylindrical shape having a large diameter D (between 1.25 inches and 2.5 inches, the diameter D preferably being equal to 1.5 inch). The low permeability of the cylindrical core 80, together with its relatively large diameter, permits the core to withstand high (2 kV p-p) voltages at high (13.56 MHz) frequency without overheating. On the other hand, the permeability (e.g., 10) provides sufficient inductive reactance by the core 80 so that a large number of windings is not required to achieve the requisite inductive reactance. In a preferred embodiment, the number of turns was 21 and may be in a range of 16 to 24 in other embodiments. This moderate number of windings minimizes self-capacitance in the winding so that the core provides the requisite inductive reactance. The inductive reactance of each core inductor 60, 62 (each being wound around a core 80 of the type described above) at the bias frequency of 13.56 MHz was about 1.7 kOhms in a preferred embodiment, and may lie in a range of 1.5 to 3 kOhms in other embodiments. The RF filter 42 is tuned to resonate well above the frequency (13.56 MHz) of the bias power generator 36 so that the filter 42 has an inductive reactance at 13.56 MHz. For example, in a preferred embodiment, the capacitors 64, 66 each had a capacitance of 0.01 microFarads which provided a filter resonant frequency of 18.7 MHz, about 5 MHz above the bias generator frequency.

Referring to FIG. 1C, each core 80 is preferably formed as a Teflon cylindrical envelope 90 of interior diameter 1.5 inches holding four fused iron powder toroids 91, 92, 93, 94 of the same exterior diameter and all of magnetic permeability 10, and arranged concentrically as illustrated. The conductors 61, 63 of the inductors 60, 62 are wrapped helically around the respective cylindrical Teflon envelopes 90. In order to avoid overheating from IR losses of the 60 Hz AC heater supply current in the inductors 60, 62, each conductor 61 is formed of thick (#8 gauge) magnet wire having a diameter of 3.2639 mm or wire with a diameter in the range of 3 mm to 3.5 mm. The length of wound conductor on each inductor 60, 62 was 2.8 meters in a preferred embodiment, but may be in a range of 2 to 4 meters.

In the preferred embodiment, each RF filter 42, 46 provided over 60 dB of RF attenuation, reaching nearly 70 dB of RF at 13.56 MHz in the preferred embodiment. At 150 Watts of RF bias power from the 13.56 bias power generator 36, the leakage current through the RF filter to ground was less than 4 milliAmps. For 150 Watts of bias power at 13.56 MHz and the heater supply power at 8 kWatts, the RF voltage was 3 kV peak-to-peak, and the filters 42, 46 showed no signs of overheating over extended operation. Moreover, the change in plasma or chamber impedance presented by the heater circuit was negligible using the above-described preferred embodiment of the RF filters 42, 46.

What is claimed is:

1. A filter for isolating a two-phase AC power supply from at least 2 kV p-p of power of an HF frequency that is reactively coupled to a resistive heating element, while conducting several kW of 60 Hz AC power from said two-phase AC power supply to the resistive heating element without overheating, said two-phase AC power supply having a pair of terminals and said resistive heating element having a pair of terminals, said filter comprising:

a pair of cylindrical non-conductive envelopes each having an interior diameter between about one and two inches;

respective pluralities of fused iron powder toroids of magnetic permeability on the order of about 10 stacked coaxially within respective ones of said pair of cylindrical envelopes, the exterior diameter of said toroids being about the same as said interior diameter of each of said envelopes; and a pair of wire conductors of diameter between 3 mm and 3.5 mm helically wound around corresponding ones of said pair of envelopes to form respective inductor windings in the range of about 16 to 24 turns for each said envelope, each of said wire conductors having an input end and an output end, the input end of each one of said wire conductors being coupled to a corresponding one of the pair of terminals of said two-phase AC power supply, and the output end of each one of said wire conductors being coupled to a corresponding one of the pair of terminals of said resistive heating element; and a pair of capacitors connected between the input ends of respective ones of said pair of wire conductors and ground, each of said capacitors having a capacitance that forms a resonance with the inductance of the corresponding one of said inductors at a resonant frequency exceeding said HF frequency, whereby said filter presents an inductive reactance at said HF frequency and has an RF attenuation of over 60 db at said HF frequency.

2. The filter of claim 1 wherein said HF frequency is at least 13.56 MHz, said exterior diameter of said toroids is 1.5 inches, the number of said turns is 21 for each said inductor winding, said capacitance of said capacitors is about 0.01 microFarads and said resonant frequency is 18.7 MHz.

3. The filter of claim 1 further comprising an AC line filter connected between the input ends of said wire conductors and said two-phase AC power supply.

4. The apparatus of claim 1 wherein each of said windings has a number of turns a range of 16 to 24.

5. The apparatus of claim 1 wherein each of said windings is connected to said AC power supply at one end of the winding, and wherein each of said capacitors is connected to a respective one of said windings at said one end.

6. The apparatus of claim 1 wherein said filter presents an inductive reactance at said HF frequency and has an RF attenuation of over 60 dB at said HF frequency.

7. A plasma reactor comprising:
   an electrostatic chuck (ESC) having a top insulating layer containing a chucking electrode and concentric inner and outer heater elements each having two terminals, and a conductive base below said insulating layer;
   an RF bias power generator of an HF frequency and an impedance match element, said generator being connected through said impedance match element to one of (a) said chucking electrode and (b) said conductive base;
   a pair of two-phase AC current supplies each having two terminals for providing current to corresponding ones of said inner and outer heating elements;
   a pair of filters for isolating said two-phase AC power supplies from at least 2 kV p-p of HF power that is reactively coupled to said resistive heating element from said bias power generator, while conducting several kW of 60 Hz AC power from each of said two-phase AC power supplies to respective ones of said resistive heating elements without overheating, each of said filters comprising:
      a pair of cylindrical non-conductive envelopes each having an interior diameter between about one and two inches;
      respective pluralities of fused iron powder toroids of magnetic permeability on the order of about 10 stacked coaxially within respective ones of said pair of cylindrical envelopes, the exterior diameter of said toroids being about the same as said interior diameter of each of said envelopes;
      a pair of wire conductors of diameter between 3 mm and 3.5 mm helically wound around corresponding ones of said pair of envelopes to form respective inductor windings in the range of about 16 to 24 turns for each said envelope, each of said wire conductors having an input end and an output end, the input end of each one of said wire conductors being coupled to a corresponding one of the pair of terminals of the corresponding two-phase AC power supply, and the output end of each one of said wire conductors being coupled to a corresponding one of the pair of terminals of the corresponding resistive heating element; and
      a pair of capacitors connected between the input ends of respective ones of said pair of wire conductors and ground, each of said capacitors having a capacitance that forms a resonance with the inductance of the corresponding one of said inductors at a resonant frequency exceeding said HF frequency, whereby said filter presents an inductive reactance at said HF frequency and has an RF attenuation of over 60 dB at said HF frequency.

8. The plasma reactor of claim 7 wherein said HF frequency is at least 13.56 MHz, said external diameter of said toroids is 1.5 inches, the number of said turns is 21 for each said inductor winding, said capacitance of said capacitors is 0.01 microFarads and said resonant frequency is 18.7 MHz.

9. The plasma reactor of claim 7 further comprising a pair of AC line filters connected between the input ends of respective ones of said wire conductors and the terminals of respective ones of said two-phase AC power supplies.

10. In a plasma reactor having an electrostatic chuck containing an electrical heating element, a bias power generator of an HF frequency coupled to an electrode of the electrostatic chuck, and an AC power supply coupled to the electrical heating element, a filter comprising:
   a pair of cylindrical non-conductive envelopes;
   respective pluralities of magnetic toroids stacked coaxially within respective ones of said pair of cylindrical envelopes; and
   a pair of wire conductors helically wound around corresponding ones of said pair of envelopes to form respective inductor windings, each of said wire conductors being connected between said AC power supply and said resistive heating element; and
   a pair of capacitors connected between respective ones of said pair of wire conductors and ground, each of said capacitors having a capacitance that forms a resonance with the inductance of the corresponding one of said inductors at resonant frequency that exceeds said HF frequency by several MHz.

11. The apparatus of claim 10 wherein each of said cylindrical nonconductive envelopes has an interior diameter between one and two inches.

12. The apparatus of claim 11 wherein said magnetic toroids comprising fused iron powder toroids of magnetic permeability on the order of 10.

13. The apparatus of claim 12 wherein each of said wire conductors is of a diameter between 3 mm and 3.5 mm.

14. The apparatus of claim 11 wherein the exterior diameter of said toroids is the same as said interior diameter of each of said envelopes.

15. The apparatus of claim 10 wherein said AC power supply has a frequency on the order of 60 Hz.

* * * * *